US009291899B2

(12) United States Patent
Cho et al.

(10) Patent No.: US 9,291,899 B2
(45) Date of Patent: Mar. 22, 2016

(54) RESIST UNDERLAYER COMPOSITION AND METHOD OF MANUFACTURING SEMICONDUCTOR INTEGRATED CIRCUIT DEVICE USING THE SAME

(75) Inventors: Hyeon-Mo Cho, Uiwang-si (KR); Sang-Kyun Kim, Uiwang-si (KR); Chang-Soo Woo, Uiwang-si (KR); Mi-Young Kim, Uiwang-si (KR); Sang-Ran Koh, Uiwang-si (KR); Hui-Chan Yun, Uiwang-si (KR); Woo-Jin Lee, Uiwang-si (KR); Jong-Seob Kim, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 427 days.

(21) Appl. No.: 12/654,737

(22) Filed: Dec. 30, 2009

(65) Prior Publication Data

US 2010/0167203 A1 Jul. 1, 2010

(30) Foreign Application Priority Data

Dec. 30, 2008 (KR) ........................ 10-2008-0137227

(51) Int. Cl.
| | |
|---|---|
| *G03F 7/075* | (2006.01) |
| *G03F 7/09* | (2006.01) |
| *G03F 7/11* | (2006.01) |
| *G03F 7/30* | (2006.01) |
| *G03F 7/36* | (2006.01) |
| *C08G 77/50* | (2006.01) |
| *C08G 77/52* | (2006.01) |
| *C08K 5/00* | (2006.01) |
| *C08L 83/04* | (2006.01) |
| *C08L 83/14* | (2006.01) |
| *C09D 183/04* | (2006.01) |
| *C09D 183/14* | (2006.01) |
| *C08G 77/12* | (2006.01) |
| *C08G 77/14* | (2006.01) |
| *C08G 77/16* | (2006.01) |
| *C08G 77/18* | (2006.01) |
| *C08G 77/20* | (2006.01) |
| *C08G 77/24* | (2006.01) |
| *C08G 77/26* | (2006.01) |
| *C08G 77/00* | (2006.01) |

(52) U.S. Cl.
CPC .............. *G03F 7/0752* (2013.01); *C08G 77/50* (2013.01); *C08G 77/52* (2013.01); *C08K 5/0008* (2013.01); *C08L 83/04* (2013.01); *C08L 83/14* (2013.01); *C09D 183/04* (2013.01); *C09D 183/14* (2013.01); *G03F 7/0757* (2013.01); *G03F 7/09* (2013.01); *G03F 7/091* (2013.01); *G03F 7/094* (2013.01); *G03F 7/11* (2013.01); *G03F 7/30* (2013.01); *G03F 7/36* (2013.01); *C08G 77/12* (2013.01); *C08G 77/14* (2013.01); *C08G 77/16* (2013.01); *C08G 77/18* (2013.01); *C08G 77/20* (2013.01); *C08G 77/24* (2013.01); *C08G 77/26* (2013.01); *C08G 77/70* (2013.01)

(58) Field of Classification Search
None
See application file for complete search history.

(56) References Cited

U.S. PATENT DOCUMENTS

| | | | |
|---|---|---|---|
| 3,017,386 | A | 1/1962 | Brown, Jr. et al. |
| 3,234,179 | A | 2/1966 | Katchman et al. |
| 5,321,102 | A | 6/1994 | Loy et al. |
| 6,576,393 | B1 | 6/2003 | Sugita et al. |
| 7,115,531 | B2 | 10/2006 | Shaffer, II et al. |
| 7,629,260 | B2 | 12/2009 | Uh et al. |
| 8,273,519 | B2 | 9/2012 | Kim et al. |
| 2002/0086169 | A1 | 7/2002 | Nakata et al. |
| 2003/0130389 | A1 | 7/2003 | Chevalier et al. |
| 2004/0109950 | A1* | 6/2004 | Adams et al. ................. 427/387 |
| 2005/0008964 | A1* | 1/2005 | Takei et al. ................. 430/270.1 |
| 2005/0282090 | A1 | 12/2005 | Hirayama et al. |
| 2008/0076059 | A1 | 3/2008 | Abdallah et al. |
| 2008/0118875 | A1 | 5/2008 | Kim et al. |
| 2008/0153033 | A1* | 6/2008 | Hyung et al. .............. 430/281.1 |
| 2009/0105395 | A1 | 4/2009 | Kamata et al. |
| 2012/0270143 | A1 | 10/2012 | Yun et al. |

FOREIGN PATENT DOCUMENTS

| | | |
|---|---|---|
| EP | 204399 A3 | 7/2010 |
| JP | 04-233544 A | 8/1992 |
| JP | 04-233544 A | 8/1992 |
| JP | 2000-356854 A | 12/2000 |
| JP | 2002-43308 * | 2/2002 |
| JP | 2005-1996 * | 1/2005 |
| JP | 2005-001996 A | 1/2005 |
| JP | 2005-336497 A | 12/2005 |
| JP | 2008-203364 | 9/2008 |
| KR | 10-2004-0051326 A | 6/2004 |
| KR | 10-2007-0095736 A | 10/2007 |

(Continued)

OTHER PUBLICATIONS

Kim et al ("Inorganic-organic Hybrid Nanoporous Materials as Adsorbent to Remove VOCs", Journal of Industrial and Engineering Chemistry 14 (2008), p. 194-201).*
Machine-assisted English translation of JP2002-43308, provided by JPO (2002).*
Derwent English abstract for JP2005-1996 (2005).*

(Continued)

*Primary Examiner* — Sin Lee
(74) *Attorney, Agent, or Firm* — Lee & Morse, P.C.

(57) ABSTRACT

A resist underlayer composition and a method of manufacturing a semiconductor integrated circuit device, the composition including a solvent and an organosilane polymer, the organosilane polymer being a condensation polymerization product of at least one first compound represented by Chemical Formulae 1 and 2 and at least one second compound represented by Chemical Formulae 3 to 5.

13 Claims, 1 Drawing Sheet

(56) References Cited

FOREIGN PATENT DOCUMENTS

| KR | 10-2007-0122250 A | 12/2007 |
| KR | 10-0796047 B1 | 1/2008 |
| KR | 10-2008-0110761 A | 12/2008 |
| TW | 200821757 | 5/2008 |
| TW | 2008-32060 | 8/2008 |
| WO | WO 2007/105859 A1 | 9/2007 |
| WO | WO 2008/018664 A1 | 2/2008 |

OTHER PUBLICATIONS

Machine-assisted English translation for JP2005-1996, as provided by JPO (2005).*
Office Action mailed Feb. 24, 2014 in corresponding Chinese Patent Application No. 200910215519.0.
Taiwanese Search Report in TW 98145884, dated Jul. 26, 2013, with English translation (Cho, et al.).
Chinese Office Action Dated Dec. 25, 2012.

* cited by examiner

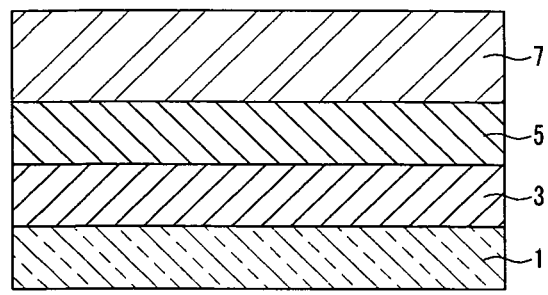

RESIST UNDERLAYER COMPOSITION AND METHOD OF MANUFACTURING SEMICONDUCTOR INTEGRATED CIRCUIT DEVICE USING THE SAME

BACKGROUND

1. Field

Embodiments relate to a resist underlayer composition and a method of manufacturing a semiconductor integrated circuit device using the same.

2. Description of the Related Art

Lithography processes may minimize reflection between a resist layer and a substrate in order to increase resolution. For this reason, an anti-reflective coating (ARC) may be used between the resist layer and the substrate to improve the resolution. However, since the anti-reflective coating material may have a similar basic composition as a resist material, the anti-reflective coating material may exhibit a poor etch selectivity with respect to the resist layer with an image imprinted therein. Therefore, an additional lithography process in a subsequent etching process may be performed. Also, resist materials may not have sufficient resistance to the subsequent etching process. When a resist layer is thin, when a substrate to be etched is thick, when an etch depth is deep, or when a particular etchant is required for a particular substrate, a resist underlayer may be used.

The resist underlayer may include, e.g., two layers having an excellent etch selectivity. Referring to FIG. 1, a first resist underlayer 3, which may be formed of an organic material, may be formed on a substrate 1. The substrate 1 may be formed of a silicon oxide layer. A second resist underlayer 5 may be formed on the first resist underlayer 3. Finally, a resist layer 7 may be formed on the second resist underlayer 5. Since the second resist underlayer 5 may have a higher etch selectivity with respect to the resist layer 7 than the substrate 1, a pattern may be easily transferred even when a thin resist layer 7 is used. The first resist underlayer 3 may be etched and the pattern may be transferred by using the second resist underlayer 5 having a pattern thereon as a mask. Then, the pattern may be transferred to the substrate 1 using the first resist underlayer 3 as a mask. To sum up, a substrate may be etched to a desired depth by using a thinner resist layer 7. The second resist underlayer may be a layer formed under the resist layer and may function as an anti-reflective coating material. The second resist underlayer may have an optical characteristic in that it may absorb light emitted from an exposer and may not reflect the light. Particularly, as semiconductor devices are miniaturized to have a linewidth of only tens of nanometers, semiconductor fabrication processes may require a delicate control of the optical characteristics.

SUMMARY

Embodiments are directed to a resist underlayer composition and a method of manufacturing a semiconductor integrated circuit device using the same, which represent advances over the related art.

It is a feature of an embodiment to provide a resist underlayer composition having an easily adjustable refractive index and absorbance at wavelengths of less than about 250 nm.

It is another feature of an embodiment to provide a resist underlayer having excellent anti-reflective characteristics.

It is another feature of an embodiment to provide a method of manufacturing a semiconductor integrated circuit device with fine patterns.

At least one of the above and other features and advantages may be realized by providing a resist underlayer composition including a solvent; and an organosilane polymer, the organosilane polymer being a condensation polymerization product of at least one first compound represented by Chemical Formulae 1 and 2 and at least one second compound represented by Chemical Formulae 3 to 5;

  [Chemical Formula 1]

  [Chemical Formula 2]

  [Chemical Formula 3]

  [Chemical Formula 4]

  [Chemical Formula 5]

wherein, in Chemical Formulae 1 to 5 $Ph^1$ is a substituted or unsubstituted phenylene group, $Ph^2$ is a substituted or unsubstituted phenyl group, $R^1$ and $R^2$ are each independently a halogen, a hydroxyl group, an alkoxy group, a carboxyl group, an ester group, a cyano group, a haloalkylsulfite group, an alkylamine group, an alkylsilylamine group, or an alkylsilyloxy group, $R^3$ is a substituted or unsubstituted C6 to C12 aryl group, $R^4$ is hydrogen or a C1 to C6 alkyl group, X is a substituted or unsubstituted linear alkylene group, a substituted or unsubstituted branched alkylene group, or an alkylene group including an alkenylene group, an alkynylene group, a heterocyclic group, an urea group, or an isocyanurate group in its main chain, l and m are each independently integers of 1 to 4, and n is an integer of 0 to 5.

The organosilane polymer may be produced by a condensation polymerization reaction of about 1 to about 99 mol % of the at least one first compound represented by Chemical Formulae 1 and 2 and about 1 to about 99 mol % of the at least one second compound represented by Chemical Formulae 3 to 5, under an acid catalyst or a base catalyst.

The organosilane polymer may have a weight average molecular weight of about 2,000 to about 50,000.

The organosilane polymer may be included in an amount of about 0.1 to about 50 wt %, based on a total weight of the resist underlayer composition.

The resist underlayer composition may further include at least one of a cross-linking agent, a radical stabilizer, and a surfactant.

The resist underlayer composition may further include a cross-linking catalyst, the cross-linking catalyst including at least one of pyridinium p-toluenesulfonate, amidosulfobetain-16, ammonium(-)-camphor-10-sulfonic acid ammonium salt, ammonium formate, alkyltriethylammonium formate, pyridinium formate, tetrabutyl ammonium acetate, tetrabutyl ammonium azide, tetrabutyl ammonium benzoate, tetrabutyl ammonium bisulfate, tetrabutyl ammonium bromide, tetrabutyl ammonium chloride, tetrabutyl ammonium cyanide, tetrabutyl ammonium fluoride, tetrabutyl ammonium iodide, tetrabutyl ammonium sulfate, tetrabutyl ammonium nitrate, tetrabutyl ammonium nitrite, tetrabutyl ammonium p-toluene sulfonate, and tetrabutyl ammonium phosphate.

The first compound may include bis(triethoxysilyl)biphenyl and the second compound may include bis(triethoxysilyl)ethane, phenyltrimethoxysilane, and methyltrimethoxysilane.

At least one of the above and other features and advantages may also be realized by providing a resist underlayer composition including a solvent; and an organosilane polymer, the organosilane polymer including a repeating unit represented by Chemical Formula 6:

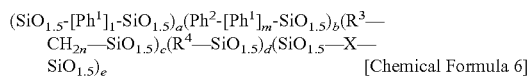

[Chemical Formula 6]

wherein, in Chemical Formula 6 $Ph^1$ is a substituted or unsubstituted phenylene group, $Ph^2$ is a substituted or unsubstituted phenyl group, $R^3$ is a substituted or unsubstituted C6 to C12 aryl group, $R^4$ is hydrogen or a C1 to C6 alkyl group, X is a substituted or unsubstituted linear alkylene group, a substituted or unsubstituted branched alkylene group, or an alkylene group including an alkenylene group, an alkynylene group, a heterocyclic group, an urea group, or an isocyanurate group in its main chain, l and m are each independently integers of 1 to 4, n is an integer of 0 to 5, and a, b, c, d, and e satisfy the relations: $0 \leq a \leq 0.99$, $0 \leq b \leq 0.99$, $0.01 \leq a+b \leq 0.99$, $0 \leq c \leq 0.99$, $0 \leq d \leq 0.99$, $0 \leq e \leq 0.99$, $0.01 \leq c+d+e \leq 0.99$, and $a+b+c+d+e=1$.

At least one of the above and other features and advantages may also be realized by providing a resist underlayer including an organosilane polymer including a repeating unit represented by Chemical Formula 6:

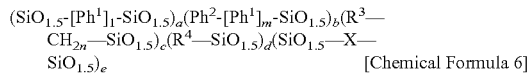

[Chemical Formula 6]

wherein, in Chemical Formula 6 $Ph^1$ is a substituted or unsubstituted phenylene group, $Ph^2$ is a substituted or unsubstituted phenyl group, $R^3$ is a substituted or unsubstituted C6 to C12 aryl group, $R^4$ is hydrogen or a C1 to C6 alkyl group, X is a substituted or unsubstituted linear alkylene group, a substituted or unsubstituted branched alkylene group, or an alkylene group including an alkenylene group, an alkynylene group, a heterocyclic group, an urea group, or an isocyanurate group in its main chain, l and m are each independently integers of 1 to 4, n is an integer of 0 to 5, and a, b, c, d, and e satisfy the relations: $0 \leq a \leq 0.99$, $0 \leq b \leq 0.99$, $0.01 \leq a+b \leq 0.99$, $0 \leq c \leq 0.99$, $0 \leq d \leq 0.99$, $0 \leq e \leq 0.99$, $0.01 \leq c+d+e \leq 0.99$, and $a+b+c+d+e=1$.

The resist underlayer may have an absorbance of greater than about 0.15 and a refractive index of less than about 1.70 under a wavelength condition of about 193 nm.

At least one of the above and other features and advantages may also be realized by providing a method of manufacturing semiconductor integrated circuit device, the method including providing a material layer on a substrate; forming a first resist underlayer on the material layer; coating the resist underlayer composition as claimed in claim 1 on the first resist underlayer to form a second resist underlayer on the first resist underlayer; forming a radiation-sensitive imaging layer on the second resist underlayer; patternwise exposing the radiation-sensitive imaging layer to radiation to form a pattern of radiation-exposed regions in the imaging layer; selectively removing portions of the radiation-sensitive imaging layer and the second resist underlayer to expose portions of the first resist underlayer; selectively removing the patterned second resist underlayer and portions of the first resist underlayer to expose portions of the material layer; and etching the exposed portions of the material layer to pattern the material layer.

The method may further include forming an anti-reflection coating after forming the second resist underlayer and prior to forming a radiation-sensitive imaging layer.

The second resist underlayer may include an organosilane polymer including a repeating unit represented by Chemical Formula 6:

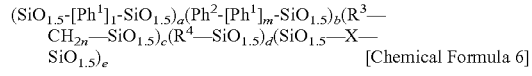

[Chemical Formula 6]

wherein, in Chemical Formula 6 $Ph^1$ is a substituted or unsubstituted phenylene group, $Ph^2$ is a substituted or unsubstituted phenyl group, $R^3$ is a substituted or unsubstituted C6 to C12 aryl group, $R^4$ is hydrogen or a C1 to C6 alkyl group, X is a substituted or unsubstituted linear alkylene group, a substituted or unsubstituted branched alkylene group, or an alkylene group including an alkenylene group, an alkynylene group, a heterocyclic group, an urea group, or an isocyanurate group in its main chain, l and m are each independently integers of 1 to 4, n is an integer of 0 to 5, and a, b, c, d, and e satisfy the relations: $0 \leq a \leq 0.99$, $0 \leq b \leq 0.99$, $0.01 \leq a+b \leq 0.99$, $0 \leq c \leq 0.99$, $0 \leq d \leq 0.99$, $0 \leq e \leq 0.99$, $0.01 \leq c+d+e \leq 0.99$, and $a+b+c+d+e=1$.

BRIEF DESCRIPTION OF THE DRAWING

The above and other features and advantages will become more apparent to those of ordinary skill in the art by describing in detail exemplary embodiments with reference to the attached drawings, in which:

FIG. 1 illustrates a cross-sectional view of a multi-layer formed by sequentially stacking a first resist underlayer, a second resist underlayer, and a resist layer on a substrate.

DETAILED DESCRIPTION

Korean Patent Application No. 10-2008-0137227, filed on Dec. 30, 2008, in the Korean Intellectual Property Office, and entitled: "Resist Underlayer Composition And Method Of Manufacturing Semiconductor Integrated Circuit Device Using The Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, when specific definition is not otherwise provided, the term "substituted" refers to one substituted with a C1 to C30 alkyl group or a C6 to C30 aryl group.

As used herein, when specific definition is not otherwise provided, the term "alkoxy" refers to —OR; and the term "ester" refers to —COOR, where R is a C1 to C30 alkyl group or a C6 to C30 aryl group.

As used herein, when specific definition is not otherwise provided, the term "alkyl" refers to a C1 to C30 alkyl; the term "alkylene" refers to C1 to C30 alkylene; the term "an aryl" refers to a C6 to C30 aryl; the term "arylene" refers to a C6 to C30 arylene; the term "alkenyl" refers to a C2 to C30 alkenyl; the term "alkenylene" refers to a C2 to C30 alkenylene; the term "alkynyl" refers to a C2 to C30 alkynyl; and the term "alkynylene" refers to a C2 to C30 alkynylene.

As used herein, when specific definition is not otherwise provided, the term "heterocyclic group" refers to a C3 to C30 heteroarylene group, a C1 to C30 heterocycloalkylene group, a C1 to C30 heterocycloalkenylene group, a C1 to C30 heterocycloalkynylene group, or a fused ring thereof, and includes a heteroatom of N, O, S, or P in a ring. The heterocyclic group includes 1 to 5 heteroatoms.

The resist underlayer composition according to an embodiment may include, e.g., a solvent and an organosilane condensation polymerization product, e.g., an organosilane polymer.

The organosilane polymer may be obtained from, e.g., at least one first compound represented by Chemical Formulae 1 to 2 and at least one second compound represented by Chemical Formulae 3 to 5. In other words, the first compound may include a compound represented by Chemical Formula 1 and/or a compound represented by Chemical Formula 2 and the second compound may include a compound represented by Chemical Formula 3, a compound represented by Chemical Formula 4, and/or a compound represented by Chemical Formula 5.

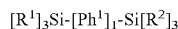  [Chemical Formula 1]

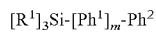  [Chemical Formula 2]

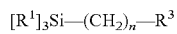  [Chemical Formula 3]

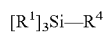  [Chemical Formula 4]

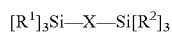  [Chemical Formula 5]

In the above Chemical Formulae 1 to 5:

$Ph^1$ may be, e.g., a substituted or unsubstituted phenylene group, $Ph^2$ may be, e.g., a substituted or unsubstituted phenyl group, $R^1$ and $R^2$ may each independently be, e.g., a halogen, a hydroxyl group, an alkoxy group, a carboxyl group, an ester group, a cyano group, a haloalkylsulfite group, an alkylamine group, an alkylsilylamine group, or an alkylsilyloxy group, $R^3$ may be, e.g., a substituted or unsubstituted C6 to C12 aryl group, $R^4$ may be, e.g., hydrogen or a C1 to C6 alkyl group, X may be, e.g., a substituted or unsubstituted linear alkylene group, a substituted or unsubstituted branched alkylene group, or an alkylene group including an alkenylene group, an alkynylene group, a heterocyclic group, an urea group, or an isocyanurate group in its main chain, l and m may each independently be, e.g., integers of 1 to 4, and n may be, e.g., an integer of 0 to 5.

In an implementation, the organosilane polymer may be produced by a hydrolysis and condensation polymerization reaction under and acid or base catalyst of about 1 to about 99 mol % of the at least one first compound and about 1 to 99 mol % of the at least one second compound. In another implementation, the at least one first compound may be used in a concentration of about 1 to about 50 mol % and the at least one second compound may be used in a concentration of about 50 to about 99 mol %, in order to achieve a desired optical characteristic controlling effect.

The organosilane polymer may have a weight average molecular weight of about 2,000 to about 50,000. In an implementation, the organosilane polymer may have a weight average molecular weight of about 3,000 to about 20,000, in consideration of coating performance on a substrate and to prevent undesirable generation of gel.

The organosilane polymer may be included in an amount of about 0.1 to about 50 wt % based on 100 wt % of the resist underlayer composition. In an implementation, the organosilane polymer may be included in an amount of about 1 to about 30 wt % in consideration of a coating performance on a substrate.

The acid catalyst or base catalyst may facilitate acquisition of the organosilane polymer having a desired molecular weight by, e.g., properly controlling a rate of the hydrolysis or condensation polymerization reaction of the first and second compounds. The acid catalyst and the base catalyst are not limited to specific ones but what is generally used in the art to which this disclosure pertains may be used. In an implementation, the acid catalyst may include, e.g., hydrofluoric acid, hydrochloric acid, bromic acid, iodic acid, nitric acid, sulfuric acid, p-toluenesulfonic acid monohydrate, diethylsulfate, 2,4,4,6-tetrabromocyclohexadienone, benzoin tosylate, 2-nitrobenzyl tosylate, alkyl esters of organic sulfonic acids, and a combination thereof. The base catalyst may include, e.g., an alkylamine such as triethylamine and diethylamine, ammonia, sodium hydroxide, potassium hydroxide, pyridine, and a combination thereof. The acid catalyst or the base catalyst may be included in an amount of about 0.001 to about 5 parts by weight, based on 100 parts by weight of the first compound and the second compound. Maintaining the amount of the acid or base catalyst at about 0.001 to about 5 parts by weight may help ensure formation of a polymer of a desired molecular weight by properly controlling the reaction rate.

In the resist underlayer composition according to an embodiment, the solvent may prevent voids and may dry a film slowly to thereby improve a planar property thereof. The kind of the solvent is not limited to specific ones, but what is generally used in the art may be the solvent. In an implementation, the solvent may include, e.g., a solvent having a high boiling point that volatilizes at a temperature slightly lower than a temperature at which the resist underlayer composition is coated, dried, and solidified. The solvent may include, e.g., toluene, propylene glycol methyl ether, propylene glycol ethyl ether, propylene glycol propyl ether, propylene glycol methyl ether acetate, propylene glycol ethyl ether acetate, propylene glycol propyl ether acetate, ethyl lactate, g-butyrolactone, methyl isobutyl ketone, or a combination thereof.

The resist underlayer composition may further include an additive including, e.g., a cross-linking agent, a radical stabilizer, a surfactant, and a combination thereof.

The resist underlayer composition may further include, e.g., a cross-linking catalyst. The cross-linking catalyst may include, e.g., pyridinium p-toluenesulfonate, amidosulfobetain-16, ammonium(-)-camphor-10-sulfonic acid ammonium salt, ammonium formate, alkyltriethylammonium formate, pyridinium formate, tetrabutyl ammonium acetate, tetrabutyl ammonium azide, tetrabutyl ammonium benzoate, tetrabutyl ammonium bisulfate, tetrabutyl ammonium bromide, tetrabutyl ammonium chloride, tetrabutyl ammonium cyanide, tetrabutyl ammonium fluoride, tetrabutyl ammonium iodide, tetrabutyl ammonium sulfate, tetrabutyl ammonium nitrate, tetrabutyl ammonium nitrite, tetrabutyl ammonium p-toluene sulfonate, tetrabutyl ammonium phosphate, and a combination thereof.

The cross-linking catalyst may be added alone or along with the additive, e.g., the cross-linking agent, the radical stabilizer, the surfactant, and combinations thereof, to the resist underlayer composition including the organosilane polymer and the solvent.

When the resist underlayer composition includes the additive, the additive may be included in an amount of, e.g., about 0.0001 to about 1 part by weight, based on 100 parts by weight of the organosilane polymer. Maintaining the amount of the additive at about 0.0001 to about 1 part by weight may help ensure a desirable storage stability.

The resist underlayer composition may include, e.g., a solvent and an organosilane polymer including a repeating unit represented by Chemical Formula 6. In other words, the organosilane polymer may have a silsequioxane structure.

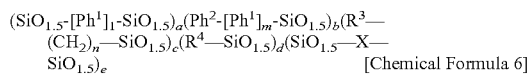   [Chemical Formula 6]

In the above Chemical Formula 6, $Ph^1$ may be, e.g., a substituted or unsubstituted phenylene group, $Ph^2$ may be, e.g., a substituted or unsubstituted phenyl group, $R^3$ may be, e.g., a substituted or unsubstituted C6 to C12 aryl group, $R^4$ may be, e.g., hydrogen or a C1 to C6 alkyl group, X may be, e.g., a substituted or unsubstituted linear alkylene group, a substituted or unsubstituted branched alkylene group, or an alkylene group including an alkenylene group, an alkynylene group, a heterocyclic group, an urea group, or an isocyanurate group in its main chain, l and m may each independently be, e.g., an integer of 1 to 4, n may be, e.g., an integer of 0 to 5, and a, b, c, d, and e may satisfy the relations: $0 \leq a \leq 0.99$, $0 \leq b \leq 0.99$, $0.01 \leq a+b \leq 0.99$, $0 \leq c \leq 0.99$, $0 \leq d \leq 0.99$, $0 \leq e \leq 0.99$, $0.01 \leq c+d+e \leq 0.99$, and $a+b+c+d+e=1$.

In the organosilane polymer having a repeating unit represented by Chemical Formula 6, e.g., the "a" unit may be a residue of the compound represented by Chemical Formula 1, the "b" unit may be a residue of the compound represented by Chemical Formula 2, the "c" unit may be a residue of the compound represented by Chemical Formula 3, the "d" unit may be a residue of the compound represented by Chemical Formula 4, and the "e" unit may be a residue of the compound represented by Chemical Formula 5.

The resist underlayer composition according to an embodiment may allow for easy control of the refractive index and absorbance of a resist underlayer at a wavelength of less than about 250 nm. Thus, the resist underlayer with excellent anti-reflective characteristics may be provided.

Another embodiment may provide a resist underlayer including an organosilane polymer including a repeating unit represented by Chemical Formula 6.

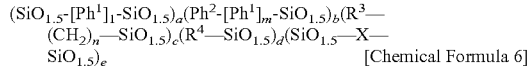   [Chemical Formula 6]

In Chemical Formula 6, $Ph^1$ may be, e.g., a substituted or unsubstituted phenylene group, $Ph^2$ may be, e.g., a substituted or unsubstituted phenyl group, $R^3$ may be, e.g., a substituted or unsubstituted C6 to C12 aryl group, $R^4$ may be, e.g., hydrogen or a C1 to C6 alkyl group, X may be, e.g., a substituted or unsubstituted linear alkylene group, a substituted or unsubstituted branched alkylene group, or an alkylene group including an alkenylene group, an alkynylene group, a heterocyclic group, an urea group, or an isocyanurate group in its main chain, l and m may each independently be, e.g., an integer of 1 to 4, n may be, e.g., an integer of 0 to 5, and a, b, c, d, and e may satisfy the relations: $0 \leq a \leq 0.99$, $0 \leq b \leq 0.99$, $0.01 \leq a+b \leq 0.99$, $0 \leq c \leq 0.99$, $0 \leq d \leq 0.99$, $0 \leq e \leq 0.99$, $0.01 \leq c+d+e \leq 0.99$, and $a+b+c+d+e=1$.

When absorbance increases, refractive index may simultaneously increase. However, when the resist underlayer composition according to an embodiment is used, it is possible to have both a low refractive and a high absorbance because the optical characteristics may be adjusted to a desired level by including the first compound represented by Chemical Formula 1 and/or Chemical Formula 2. In an implementation, the resist underlayer may have an absorbance of greater than about 0.15 when the refractive index is less than about 1.70 under a wavelength condition of about 193 nm.

Another embodiment may provide a method of manufacturing a semiconductor integrated circuit device. The method may include, e.g., (a) providing a material layer on a substrate; (b) forming a first resist underlayer on the material layer; (c) coating the resist underlayer composition of an embodiment on the first resist underlayer to form a second resist underlayer; (d) forming a radiation-sensitive imaging layer on the second resist underlayer; (e) patternwise exposing the radiation-sensitive imaging layer to radiation to form a pattern of radiation-exposed regions in the imaging layer; (f) selectively removing portions of the radiation-sensitive imaging layer and the second resist underlayer to expose portions of the first resist underlayer; (g) selectively removing the patterned second resist underlayer and portions of the first resist underlayer to expose portions of the material layer; and (h) etching the exposed portions of the material layer to pattern the material layer The method may further include forming an anti-reflection coating after forming the second resist underlayer and prior to forming the radiation-sensitive imaging layer.

The second resist underlayer may include an organosilane polymer including a repeating unit represented by Chemical Formula 6.

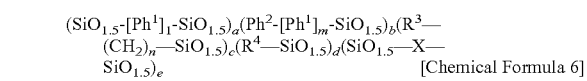   [Chemical Formula 6]

In Chemical Formula 6, $Ph^1$ may be, e.g., a substituted or unsubstituted phenylene group, $Ph^2$ may be, e.g., a substituted or unsubstituted phenyl group, $R^3$ may be, e.g., a substituted or unsubstituted C6 to C12 aryl group, $R^4$ may be, e.g., hydrogen or a C1 to C6 alkyl group, X may be, e.g., a substituted or unsubstituted linear alkylene group, a substituted or unsubstituted branched alkylene group, or an alkylene group including an alkenylene group, an alkynylene group, a heterocyclic group, an urea group, or an isocyanurate group in its main chain, l and m may each independently be, e.g., an integer of 1 to 4, n may be, e.g., an integer of 0 to 5, and a, b, c, d, and e may satisfy the relations: $0 \leq a \leq 0.99$, $0 \leq b \leq 0.99$, $0.01 \leq a+b \leq 0.99$, $0 \leq c \leq 0.99$, $0 \leq d \leq 0.99$, $0 \leq e \leq 0.99$, $0.01 \leq c+d+e \leq 0.99$, and $a+b+c+d+e=1$.

A method of forming a patterned material layer may be carried out in accordance with the following procedure.

First, a material layer to be patterned, e.g., aluminum or silicon nitride (SiN), may be applied to a silicon substrate by any suitable technique known in the art. The material layer may be, e.g., an electrically conductive, semi-conductive, magnetic, or insulating material.

A first resist underlayer including an organic material may be disposed on the material layer. The first resist underlayer may include, e.g., an organic material including carbon, hydrogen, oxygen, and the like, and may have a thickness of about 200 Å to about 12000 Å. The first resist underlayer is not limited and may be formed according to various thicknesses using various materials by a person skilled in this art.

Then, the resist underlayer composition of an embodiment may be spin-coated to a thickness of about 100 Å to about 4000 Å and baked at about 100° C. to about 300° C. for about 10 seconds to about 10 minutes to form a second resist underlayer. The thickness, baking temperature, and baking time are not limited, and the second resist underlayer may be formed according to various thicknesses, baking temperature, and baking time by a person skilled in this art.

A radiation-sensitive imaging layer may be formed on the second resist underlayer. Light exposure and development may be performed to form a pattern on the imaging layer. The imaging layer and antireflective layer may be selectively removed to expose portions of the material layer. Dry etching may be performed using an etching gas. The etching gas may include, e.g., $CHF_3$, $CH_2F_2$, $CF_4$, $CH_4$, $N_2$, $O_2$, $Cl_2$, $BCl_3$, or a mixed gas. After patterning the material layer, remaining resist and underlayer may be removed using a photoresist stripper.

Another embodiment may provide a semiconductor integrated circuit device fabricated using the method. In particular, the method of an embodiment may be used to form a patterned material layer structure such as metal wiring line, hole for contact or bias; an insulation section such as a multi-mask trench or shallow trench insulation; and a trench for a capacitor structure such as designing of an integrated circuit device. Also, the method may be used to form a patterned layer of, e.g., oxide, nitride, polysilicon, and/or chromium. The embodiments are not limited to a specific lithographic method or a specific device structure.

The following examples illustrate this disclosure in more detail. However, it is understood that this disclosure is not limited by these examples. A person having ordinary skills in this art may sufficiently understand parts of this disclosure that are not specifically described.

Comparative Example 1

630 g of methyltrimethoxysilane (MT) was put into a 3 l 4-neck flask including a mechanical agitator, a condenser, a dropping funnel, and a nitrogen gas introduction tube, and dissolved in 1600 g of PGMEA. Then, 300 g of a 5000 ppm nitric acid aqueous solution was added thereto. Subsequently, the solution was reacted at about 90° C. for about a 1 week. After the reaction, an organosilane polymer A1 (weight average molecular weight=8000, polydispersity (PD)=3.8) was acquired.

100 g of PGMEA was poured into 5 g of the acquired polymer to thereby prepare a diluted solution. 0.5 g of pyridinium p-toluenesulfonate as added to the diluted solution to thereby prepare a resist underlayer composition.

The resist underlayer composition was applied to a silicon wafer through a spin-coating method and the silicon wafer coated with resist underlayer composition was baked at a temperature of about 200° C. for about one minute to thereby form a resist underlayer having a thickness of about 1000 Å.

Comparative Example 2

621 g (99 mol %) of methyltrimethoxysilane (MT) and 9 g (1 mol %) of phenyltrimethoxysilane (PT) were put into a 3 l 4-neck flask including a mechanical agitator, a condenser, a dropping funnel, and a nitrogen gas introduction tube, and dissolved in 1600 g of PGMEA. Then, 300 g of a 1% nitric acid aqueous solution was added thereto. Subsequently, the solution was reacted at about 100° C. for about a week. After the reaction, an organosilane polymer A2 (weight average molecular weight=9500, polydispersity (PD)=4) was acquired.

Subsequent processes, except for the process of acquiring the organosilane polymer, were performed the same as Comparative Example 1.

Comparative Example 3

594 g (96 mol %) of methyltrimethoxysilane (MT) and 36 g (4 mol %) of phenyltrimethoxysilane were put into a 3 l 4-neck flask including a mechanical agitator, a condenser, a dropping funnel, and a nitrogen gas introduction tube, and dissolved in 1600 g of PGMEA. Then, 300 g of a 1% nitric acid aqueous solution was added thereto. Subsequently, the solution as reacted at about 100° C. for about a week. After the reaction, an organosilane polymer A3 (weight average molecular weight=8000, polydispersity (PD)=3.7) w acquired.

Subsequent processes, except for the process of acquiring the organosilane polymer, were performed the same as Comparative Example 1.

Comparative Example 4

568 g (93 mol %) of methyltrimethoxysilane (MT) and 62 g (7 mol %) of phenyltrimethoxysilane (PT) were put into a 3 l 4-neck flask including a mechanical agitator, a condenser, a dropping funnel, and a nitrogen gas introduction tube, and dissolved in 1600 g of PGMEA. Then, 300 g of a 1% nitric acid aqueous solution was added thereto. Subsequently, the solution was reacted at about 100° C. for about a week. After the reaction, an organosilane polymer A4 (weight average molecular weight=7000, polydispersity (PD)=3.5) was acquired.

Subsequent processes, except for the process of acquiring the organosilane polymer, were performed the same as Comparative Example 1.

Comparative Example 5

534 g (89 mol %) of methyltrimethoxysilane (MT) and 96 g (11 mol %) of phenyltrimethoxysilane (PT) were put into a 3 l 4-neck flask including a mechanical agitator, a condenser, a dropping funnel, and a nitrogen gas introduction tube, and dissolved in 1600 g of PGMEA. Then, 300 g of a 1% nitric acid aqueous solution was added thereto. Subsequently, the solution was reacted at about 100° C. for about a week. After the reaction, an organosilane polymer A5 (weight average molecular weight=5500, polydispersity (PD)=3.0) was acquired.

Subsequent processes, except for the process of acquiring the organosilane polymer, were performed the same as Comparative Example 1.

Comparative Example 6

501 g (85 mol %) of methyltrimethoxysilane (MT) and 129 g (15 mol %) of phenyltrimethoxysilane (PT) were put into a 3 l 4-neck flask including a mechanical agitator, a condenser, a dropping funnel, and a nitrogen gas introduction tube, and dissolved in 1600 g of PGMEA. Then, 300 g of a 1% nitric acid aqueous solution was added thereto. Subsequently, the solution was reacted at about 100° C. for about a week. After the reaction, an organosilane polymer A6 (weight average molecular weight=6000, polydispersity (PD)=3.1) was acquired.

Subsequent processes, except for the process of acquiring the organosilane polymer, were performed the same as Comparative Example 1.

Comparative Example 7

424 g (75 mol %) of methyltrimethoxysilane (MT) and 206 g (25 mol %) of phenyltrimethoxysilane (PT) were put into a 3 l 4-neck flask including a mechanical agitator, a condenser, a dropping funnel, and a nitrogen gas introduction tube, and dissolved in 1600 g of PGMEA. Then, 300 g of a 2% nitric acid aqueous solution was added thereto. Subsequently, the solution was reacted at about 100° C. for about a week. After the reaction, an organosilane polymer A7 (weight average molecular weight=7500, polydispersity (PD)=3.6) was acquired.

Subsequent processes, except for the process of acquiring the organosilane polymer, were performed the same as Comparative Example 1.

Comparative Example 8

630 g of phenyltrimethoxysilane (PT) was put into a 3 l 4-neck flask including a mechanical agitator, a condenser, a dropping funnel, and a nitrogen gas introduction tube, and dissolved in 1600 g of PGMEA. Then, 300 g of a 3% nitric acid aqueous solution was added thereto. Subsequently, the solution was reacted at about 100° C. for about a week. After the reaction, an organosilane polymer A8 (weight average molecular weight=3000, polydispersity (PD)=3.0) was acquired.

Subsequent processes, except for the process of acquiring the organosilane polymer, were performed the same as Comparative Example 1.

Example 1

122 g of bis(triethoxysilyl)biphenyl (BBP), 451 g of bis(triethoxysilyl)ethane (BE), 25 g of phenyltrimethoxysilane (PT), and 120 g of methyltrimethoxysilane (MT) were put into a 3 l 4-neck flask including a mechanical agitator, a condenser, a dropping funnel, and a nitrogen gas introduction tube, and dissolved in 1800 g of PGMEA. Then, 200 g of a 5000 ppm nitric acid aqueous solution was added thereto. Subsequently, the solution was reacted at about 80° C. for about 3 days. After the reaction, an organosilane polymer B1 (weight average molecular weight=7000, polydispersity (PD)=3) was acquired.

Subsequent processes, except for the process of acquiring the organosilane polymer, were performed the same as Comparative Example 1.

Example 2

217 g of bis(triethoxysilyl)biphenyl (BBP), 403 g of bis(triethoxysilyl)ethane (BE), 23 g of phenyltrimethoxysilane (PT), and 77 g of methyltrimethoxysilane (MT) were put into a 3 l 4-neck flask including a mechanical agitator, a condenser, a dropping funnel, and a nitrogen gas introduction tube, and dissolved in 1800 g of PGMEA. Then, 250 g of a 5000 ppm nitric acid aqueous solution was added thereto. Subsequently, the solution was reacted at about 80° C. for about 5 days. After the reaction, an organosilane polymer B2 (weight average molecular weight=9700, polydispersity (PD)=4) was acquired.

Subsequent processes, except for the process of acquiring the organosilane polymer, were performed the same as Comparative Example 1.

Example 3

176 g of bis(triethoxysilyl)biphenyl (BBP), 326 g of bis(triethoxysilyl)ethane (BE), 73 g of phenyltrimethoxysilane (PT), and 25 g of methyltrimethoxysilane (MT) were put into a 3 l 4-neck flask including a mechanical agitator, a condenser, a dropping funnel, and a nitrogen gas introduction tube, and dissolved in 1000 g of PGMEA. Then, 130 g of a 2000 ppm nitric acid aqueous solution was added thereto. Subsequently, the solution was reacted at about 60° C. for about 3 days. After the reaction, an organosilane polymer B3 (weight average molecular weight=7000, polydispersity (PD)=3) was acquired.

Subsequent processes, except for the process of acquiring the organosilane polymer, were performed the same as Comparative Example 1.

Example 4

92 g of bis(triethoxysilyl)biphenyl (BBP), 38 g of phenyltrimethoxysilane (PT), and 470 g of methyltrimethoxysilane (MT) were put into a 3 l 4-neck flask including a mechanical agitator, a condenser, a dropping funnel, and a nitrogen gas introduction tube, and dissolved in 1000 g of PGMEA. Then, 200 g of a 5000 ppm nitric acid aqueous solution was added thereto. Subsequently, the solution was reacted at about 80° C. for about 5 days. After the reaction, an organosilane polymer B4 (weight average molecular weight=8500, polydispersity (PD)=3.7) was acquired.

Subsequent processes, except for the process of acquiring the organosilane polymer, were performed the same as Comparative Example 1.

Example 5

39 g of bis(triethoxysilyl)biphenyl (BBP), 64 g of phenyltrimethoxysilane (PT), and 497 g of methyltrimethoxysilane (MT) were put into a 3 l 4-neck flask including a mechanical agitator, a condenser, a dropping funnel, and a nitrogen gas introduction tube, and dissolved in 1000 g of PGMEA. Then, 200 g of a 5000 ppm nitric acid aqueous solution was added thereto. Subsequently, the solution was reacted at about 80° C. for about 4 days. After the reaction, an organosilane polymer B5 (weight average molecular weight=8000, polydispersity (PD)=3.4) was acquired.

Subsequent processes, except for the process of acquiring the organosilane polymer, were performed the same as Comparative Example 1.

Example 6

75 g of bis(triethoxysilyl)biphenyl (BBP), 39 g of phenyltrimethoxysilane (PT), and 486 g of methyltrimethoxysilane (MT) were put into a 3 l 4-neck flask including a mechanical agitator, a condenser, a dropping funnel, and a nitrogen gas introduction tube, and dissolved in 1200 g of PGMEA. Then, 180 g of a 5000 ppm nitric acid aqueous solution was added thereto. Subsequently, the solution was reacted at about 80° C. for about 4 days. After the reaction, an organosilane polymer B6 (weight average molecular weight=8500, polydispersity (PD)=3.6) was acquired.

Subsequent processes, except for the process of acquiring the organosilane polymer, were performed the same as Comparative Example 1.

Experimental Example 1

Refractive indices (n) and absorbances (k) of resist underlayers according to Comparative Examples 1 to 8 and Examples 1 to 6 were measured using an ellipsometer (J. A. Woollam). The results are shown in Tables 1 and 2.

TABLE 1

|  | MT (mol %) | PT (mol %) | Polymer | Mw | Refractive index (193 nm) | Absorbance (193 nm) |
|---|---|---|---|---|---|---|
| Comparative Example 1 | 100 | 0 | A1 | 8000 | 1.52 | 0.00 |
| Comparative Example 2 | 99 | 1 | A2 | 9500 | 1.55 | 0.02 |
| Comparative Example 3 | 96 | 4 | A3 | 8000 | 1.60 | 0.08 |
| Comparative Example 4 | 93 | 7 | A4 | 7000 | 1.65 | 0.15 |
| Comparative Example 5 | 89 | 11 | A5 | 5500 | 1.70 | 0.21 |
| Comparative Example 6 | 85 | 15 | A6 | 6000 | 1.73 | 0.26 |
| Comparative Example 7 | 75 | 25 | A7 | 7500 | 1.77 | 0.47 |
| Comparative Example 8 | 0 | 100 | A8 | 3000 | 1.86 | 1.00 |

\* MT: (methyltrimethoxysilane)
\* PT: (phenyltrimethoxysilane)

TABLE 2

|  | BBP (mol %) | MT (mol %) | PT (mol %) | BE (mol %) | Polymer | Mw | Refractive index (193 nm) | Absorbance (193 nm) |
|---|---|---|---|---|---|---|---|---|
| Example 1 | 10 | 35 | 5 | 50 | B1 | 7000 | 1.60 | 0.17 |
| Example 2 | 20 | 25 | 5 | 50 | B2 | 9700 | 1.58 | 0.23 |
| Example 3 | 20 | 10 | 20 | 50 | B3 | 7000 | 1.67 | 0.35 |
| Example 4 | 5 | 90 | 5 | 0 | B4 | 8500 | 1.57 | 0.21 |
| Example 5 | 2 | 90 | 8 | 0 | B5 | 8000 | 1.64 | 0.21 |
| Example 6 | 4 | 91 | 5 | 0 | B6 | 8500 | 1.58 | 0.19 |

\* BBP: (bis(triethoxysilyl)biphenyl)
\* MT: (methyltrimethoxysilane)
\* PT: (phenyltrimethoxysilane)
\* BE: (bis(triethoxysilyl)ethane)

Referring to Table 1, the resist underlayers formed according to Comparative Examples 1 to 8 using conventional organosilane polymers exhibited increased refractive indices as absorbance increased. Thus, in the resist underlayers of Comparative Examples 1 to 8, it may be impossible to have a low refractive index under a condition of high absorbance. In short, it may be confirmed that the absorbance and the refractive index were hardly modified.

However, referring to Table 2, the resist underlayers using the resist underlayer composition according to an embodiment, i.e., Examples 1 to 6, exhibited low refractive index under a condition of high absorbance. In addition, the resist underlayers according to Examples 1 to 6 exhibited a high refractive index under a condition of low absorbance. In an embodiment, the resist underlayer may have an absorbance of greater than 0.15 when it has a refractive index of less than about 1.70 under a wavelength condition of less than about 250 nm, e.g., under a wavelength condition of about 193 nm.

In order to realize a high-resolution resist pattern, it may be desirable to control the refractive index and absorbance of the second resist underlayer 5. A phenyl group, which is a simple light absorbing material, may be used to increase the absorbance. The resist underlayer of an embodiment may allow the refractive index to remain stable as an amount of the phenyl group becomes higher. Thus, it may be easy to maintain the low refractive index. The composition of an embodiment may be, e.g., a light absorbing material that may facilitate controlling the refractive index and absorbance.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A resist underlayer composition, comprising:
   a solvent;
   a cross-linking catalyst, the cross-linking catalyst including at least one of pyridinium p-toluenesulfonate, amidosulfobetain-16, ammonium(-)-camphor-10-sulfonic acid ammonium salt, ammonium formate, alkyltriethylammonium formate, pyridinium formate, tetrabutyl ammonium acetate, tetrabutyl ammonium azide, tetrabutyl ammonium benzoate, tetrabutyl ammonium bisulfate, tetrabutyl ammonium bromide, tetrabutyl ammonium chloride, tetrabutyl ammonium cyanide, tetrabutyl ammonium fluoride, tetrabutyl ammonium iodide, tetrabutyl ammonium sulfate, tetrabutyl ammonium nitrate, tetrabutyl ammonium nitrite, tetrabutyl ammonium p-toluene sulfonate, and tetrabutyl ammonium phosphate; and
   an organosilane polymer, the organosilane polymer being a condensation polymerization product of:
   at least one first compound represented by Chemical Formula 1 or 2, and
   at least one second compound represented by any one of Chemical Formulae 3 to 5
   wherein the at least one first compound represented by Chemical Formula 1 or 2 includes at least one compound represented by Chemical Formula 1, and the at least one second compound represented by any one of Chemical Formulae 3 to 5 includes at least one compound represented by Chemical Formula 3, at least one compound represented by Chemical Formula 4, and at least one compound represented by Chemical Formula 5;

$[R^1]_3Si\text{-}[Ph^1]_l\text{-}Si[R^2]_3$      [Chemical Formula 1]

$[R^1]_3Si\text{-}[Ph^1]_m\text{-}Ph^2$      [Chemical Formula 2]

$[R^1]_3Si\text{—}(CH_2)_n\text{—}R^3$      [Chemical Formula 3]

$[R^1]_3Si\text{—}R^4$      [Chemical Formula 4]

$[R^1]_3Si\text{—}X\text{—}Si[R^2]_3$      [Chemical Formula 5]

wherein, in Chemical Formulae 1 to 5:
$Ph^1$ is a substituted or unsubstituted phenylene group,
$Ph^2$ is a substituted or unsubstituted phenyl group,
$R^1$ and $R^2$ are each independently a halogen, a hydroxyl group, an alkoxy group, a carboxyl group, an ester group, a cyano group, a haloalkylsulfite group, an alkylamine group, an alkylsilylamine group, or an alkylsilyloxy group,
$R^3$ is a substituted or unsubstituted C6 to C12 aryl group,
$R^4$ is hydrogen or a C1 to C6 alkyl group,
X is a substituted or unsubstituted linear alkylene group, a substituted or unsubstituted branched alkylene group, or an alkylene group including an alkenylene group, an alkynylene group, a heterocyclic group, a urea group, or an isocyanurate group in its main chain,
l is an integer of 2 to 4, and m is an integer of 1 to 4, and n is an integer of 0 to 5.

2. The resist underlayer composition as claimed in claim 1, wherein the organosilane polymer is produced by a condensation polymerization reaction of about 1 to about 99 mol % of the at least one first compound, and about 1 to about 99 mol % of the at least one second compound, under an acid catalyst or a base catalyst.

3. The resist underlayer composition as claimed in claim 1, wherein the organosilane polymer has a weight average molecular weight of about 2,000 to about 50,000.

4. The resist underlayer composition as claimed in claim 1, wherein the organosilane polymer is included in an amount of about 0.1 to about 50 wt %, based on a total weight of the resist underlayer composition.

5. The resist underlayer composition as claimed in claim 1, further comprising at least one of a cross-linking agent, a radical stabilizer, and a surfactant.

6. The resist underlayer composition as claimed in claim 1, wherein:
the at least one first compound includes bis(triethoxysilyl)biphenyl, and
the at least one second compound includes bis(triethoxysilyl)ethane, phenyltrimethoxysilane, and methyltrimethoxysilane.

7. A method of manufacturing semiconductor integrated circuit device, the method comprising:
providing a material layer on a substrate;
forming a first resist underlayer on the material layer;
coating the resist underlayer composition as claimed in claim 1 on the first resist underlayer to form a second resist underlayer on the first resist underlayer;
forming a radiation-sensitive imaging layer on the second resist underlayer;
patternwise exposing the radiation-sensitive imaging layer to radiation to form a pattern of radiation-exposed regions in the imaging layer;
selectively removing portions of the radiation-sensitive imaging layer and the second resist underlayer to expose portions of the first resist underlayer;
selectively removing the patterned second resist underlayer and portions of the first resist underlayer to expose portions of the material layer; and
etching the exposed portions of the material layer to pattern the material layer.

8. The method as claimed in claim 7, further comprising forming an anti-reflection coating after forming the second resist underlayer and prior to forming a radiation-sensitive imaging layer.

9. The method as claimed in claim 7, wherein the second resist underlayer includes an organosilane polymer including a repeating unit represented by Chemical Formula 6:

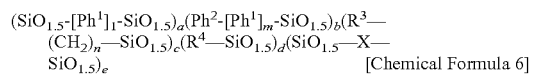
    [Chemical Formula 6]

wherein, in Chemical Formula 6:
$Ph^1$ is a substituted or unsubstituted phenylene group,
$Ph^2$ is a substituted or unsubstituted phenyl group,
$R^3$ is a substituted or unsubstituted C6 to C12 aryl group,
$R^4$ is hydrogen or a C1 to C6 alkyl group,
X is a substituted or unsubstituted linear alkylene group, a substituted or unsubstituted branched alkylene group, or an alkylene group including an alkenylene group, an alkynylene group, a heterocyclic group, an urea group, or an isocyanurate group in its main chain,
l is an integer of 2 to 4, and m is an integer of 1 to 4,
n is an integer of 0 to 5, and
a, b, c, d, and e satisfy the relations: $0<a\leq 0.99$, $0\leq b\leq 0.99$, $0.01\leq a+b\leq 0.99$, $0<c\leq 0.99$, $0<d\leq 0.99$, $0<e\leq 0.99$, $0.01\leq c+d+e\leq 0.99$, and $a+b+c+d+e=1$.

10. A resist underlayer composition, comprising:
a solvent;
a cross-linking catalyst, the cross-linking catalyst including at least one of pyridinium p-toluenesulfonate, amidosulfobetain-16, ammonium(-)-camphor-10-sulfonic acid ammonium salt, ammonium formate, alkyltriethylammonium formate, pyridinium formate, tetrabutyl ammonium acetate, tetrabutyl ammonium azide, tetrabutyl ammonium benzoate, tetrabutyl ammonium bisulfate, tetrabutyl ammonium bromide, tetrabutyl ammonium chloride, tetrabutyl ammonium cyanide, tetrabutyl ammonium fluoride, tetrabutyl ammonium iodide, tetrabutyl ammonium sulfate, tetrabutyl ammonium nitrate, tetrabutyl ammonium nitrite, tetrabutyl ammonium p-toluene sulfonate, and tetrabutyl ammonium phosphate; and
an organosilane polymer, the organosilane polymer including a repeating unit represented by Chemical Formula 6:

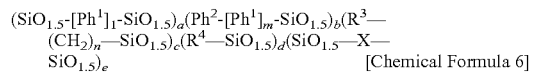
    [Chemical Formula 6]

wherein, in Chemical Formula 6:
$Ph^1$ is a substituted or unsubstituted phenylene group,
$Ph^2$ is a substituted or unsubstituted phenyl group,
$R^3$ is a substituted or unsubstituted C6 to C12 aryl group,
$R^4$ is hydrogen or a C1 to C6 alkyl group,
X is a substituted or unsubstituted linear alkylene group, a substituted or unsubstituted branched alkylene group, or an alkylene group including an alkenylene group, an alkynylene group, a heterocyclic group, a urea group, or an isocyanurate group in its main chain,
l is an integer of 2 to 4, and m is an integer of 1 to 4,
n is an integer of 0 to 5, and a, b, c, d, and e satisfy the relations: $0 < a \leq 0.99$, $0 \leq b \leq 0.99$, $0.01 \leq a+b \leq 0.99$, $0 < c \leq 0.99$, $0 < d \leq 0.99$, $0 < e \leq 0.99$, $0.01 \leq c+d+e \leq 0.99$, and $a+b+c+d+e=1$.

11. A resist underlayer, comprising:

an organosilane polymer including a repeating unit represented by Chemical Formula 6:

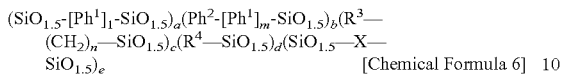   [Chemical Formula 6]

wherein, in Chemical Formula 6:

$Ph^1$ is a substituted or unsubstituted phenylene group, $Ph^2$ is a substituted or unsubstituted phenyl group, $R^3$ is a substituted or unsubstituted C6 to C12 aryl group, $R^4$ is hydrogen or a C1 to C6 alkyl group, X is a substituted or unsubstituted linear alkylene group, a substituted or unsubstituted branched alkylene group, or an alkylene group including an alkenylene group, an alkynylene group, a heterocyclic group, a urea group, or an isocyanurate group in its main chain, l is an integer of 2 to 4, and m is an integer of 1 to 4, n is an integer of 0 to 5, and a, b, c, d, and e satisfy the relations: $0 < a \leq 0.99$, $0 \leq b \leq 0.99$, $0.01 \leq a+b \leq 0.99$, $0 < c \leq 0.99$, $0 < d \leq 0.99$, $0 < e \leq 0.99$, $0.01 \leq c+d+e \leq 0.99$, and $a+b+c+d+e=1$.

12. The resist underlayer as claimed in claim 11, wherein the resist underlayer has an absorbance of greater than about 0.15 and a refractive index of less than about 1.70 under a wavelength condition of about 193 nm.

13. A resist underlayer composition, comprising:

a solvent;

a cross-linking catalyst; and an organosilane polymer, the organosilane polymer being a condensation polymerization product of bis(triethoxysilyl)biphenyl, phenyltrimethoxysilane, and methyltrimethoxysilane.

* * * * *